(12) United States Patent
Sakamaki et al.

(10) Patent No.: US 8,054,127 B2
(45) Date of Patent: Nov. 8, 2011

(54) FEEDFORWARD DISTORTION COMPENSATION AMPLIFIER

(75) Inventors: Keiichi Sakamaki, Kodaira (JP); Hiroichi Yonenaga, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 3 days.

(21) Appl. No.: 12/656,160

(22) Filed: Jan. 20, 2010

(65) Prior Publication Data

US 2010/0182081 A1 Jul. 22, 2010

(30) Foreign Application Priority Data

Jan. 20, 2009 (JP) ................. 2009-010162

(51) Int. Cl.
*H03F 1/00* (2006.01)
(52) U.S. Cl. ........................ 330/151; 330/149
(58) Field of Classification Search .................. 330/149, 330/151; 455/114.2
See application file for complete search history.

(56) References Cited

U.S. PATENT DOCUMENTS 6,255,903 B1 * 7/2001 Leffel ............................. 330/51

* cited by examiner

*Primary Examiner* — Robert Pascal
*Assistant Examiner* — Khiem Nguyen
(74) *Attorney, Agent, or Firm* — Bacon & Thomas, PLLC

(57) ABSTRACT

A feedforward distortion compensation amplifier includes an adjusting unit for adjusting a gain and a phase of an input signal, a first amplifier for amplifying a signal outputted from the adjusting unit, a delay unit for delaying the input signal, and a coupler for coupling a signal outputted from the delay unit to a signal outputted from the first amplifier. The feedforward distortion compensation amplifier further includes a first controller which detects a distortion component of the first amplifier to control an operation of the adjusting unit based on the distortion component, and a second controller which determines one distortion level from distortion levels based on a magnitude of the input signal, and compares the determined distortion level with the detected distortion component of the first amplifier to control an amplification rate of the first amplifier based on comparison results.

6 Claims, 5 Drawing Sheets

FIG.3

| INPUT POWER[mW] | TARGET DISTORTION LEVEL[mW] |
|---|---|
| 0~100 | 5 |
| 200 | 10 |
| 300 | 15 |
| 400 | 20 |
| ⋮ | ⋮ |

FIG.4

| CONTROL NUMBER | DRAIN VOLTAGE[V] | GATE VOLTAGE[V] |
|---|---|---|
| 1 | 0.1 | 0.2 |
| 2 | 0.2 | 0.4 |
| 3 | 0.3 | 0.6 |
| 4 | 0.4 | 0.8 |
| ⋮ | ⋮ | ⋮ |

FIG. 6

WHEN Z=1

| TARGET DISTORTION LEVEL[mW] | DRAIN VOLTAGE[V] | GATE VOLTAGE[V] |
|---|---|---|
| 5 | 0.1 | 0.2 |
| 10 | 0.2 | 0.4 |
| 15 | 0.3 | 0.6 |
| 20 | 0.4 | 0.8 |
| ⋮ | ⋮ | ⋮ |
| ⋮ | ⋮ | ⋮ |

FEEDFORWARD DISTORTION COMPENSATION AMPLIFIER

FIELD OF THE INVENTION

The present invention relates to a distortion compensation amplifier having a feedforward loop for compensating for intermodulation distortion generated by a main amplifier.

BACKGROUND OF THE INVENTION

Recently, a wireless mobile communication system such as a mobile telephone and a personal handyphone system (PHS) is widely used. In such a wireless mobile communication system, a base station and a relay station for mobile communications RF-amplify a multi-carrier signal including a plurality of carrier waves appropriately modulated at a predetermined frequency interval and then wirelessly transmit the RF-amplified multi-carrier signal. When the linearity of the amplifier used for RF amplification is not sufficiently high, various distortions such as intermodulation distortion are generated.

This distortion prevents the realization of normal or high quality communications. Therefore, high linearity is required for the amplifier used to amplify the multi-carrier signal over the entire frequency band, to which the multi-carrier signal belongs. A feedforward distortion compensation method is known as a method of realizing an ultra-low distortion amplifier for amplifying the multi-carrier signal.

Patent Document 1 discloses a method for controlling a feedforward distortion compensation amplifier capable of suppressing power consumption when power is applied to stabilize an operation.

[Patent Document 1] Japanese Patent Laid-open Publication No. 2004-120545

However, in the conventional technique of Patent Document 1 in particular, when an input signal has a low power level, a sufficiently efficient amplification process is not performed in the range of a distortion level defined by a standard.

SUMMARY OF THE INVENTION

In view of the above, the present invention provides a feedforward distortion compensation amplifier for performing a sufficiently efficient amplification process in the range of a distortion level defined by a standard even when an input signal has a low power level.

In accordance with an embodiment of the present invention, there is provided a feedforward distortion compensation amplifier, comprising: an adjusting unit for adjusting a gain and a phase of an input signal; a first amplifier for amplifying a signal outputted from the adjusting unit; a delay unit for delaying the input signal; a coupler for coupling a signal outputted from the delay unit to a signal outputted from the first amplifier; a first controller which detects a distortion component of the first amplifier to control an operation of the adjusting unit based on the distortion component; and a second controller which determines one distortion level from distortion levels based on a magnitude of the input signal, and compares the determined distortion level with the detected distortion component of the first amplifier to control an amplification rate of the first amplifier based on comparison results.

Even when an input signal has a low power level, it is possible to realize a proper amplification rate of the amplifier, thereby controlling a highly efficient feedforward distortion compensation amplifier while satisfying the required distortion standard.

BRIEF DESCRIPTION OF THE DRAWINGS

The objects and features of the present invention will become apparent from the following description of preferred embodiments, given in conjunction with the accompanying drawings, in which:

FIG. 3 is a table illustrating an example of target distortion levels corresponding to input powers;

FIG. 4 is a voltage table showing an example of gradual control voltages for controlling an amplifier;

FIG. 6 is an exemplary voltage table illustrating a relationship among a distortion level, a drain voltage, and a gate voltage.

DETAILED DESCRIPTION OF THE EMBODIMENTS

Hereinafter, embodiments of the present invention will be described in detail with reference to the drawings which form a part hereof.

Figure 1:
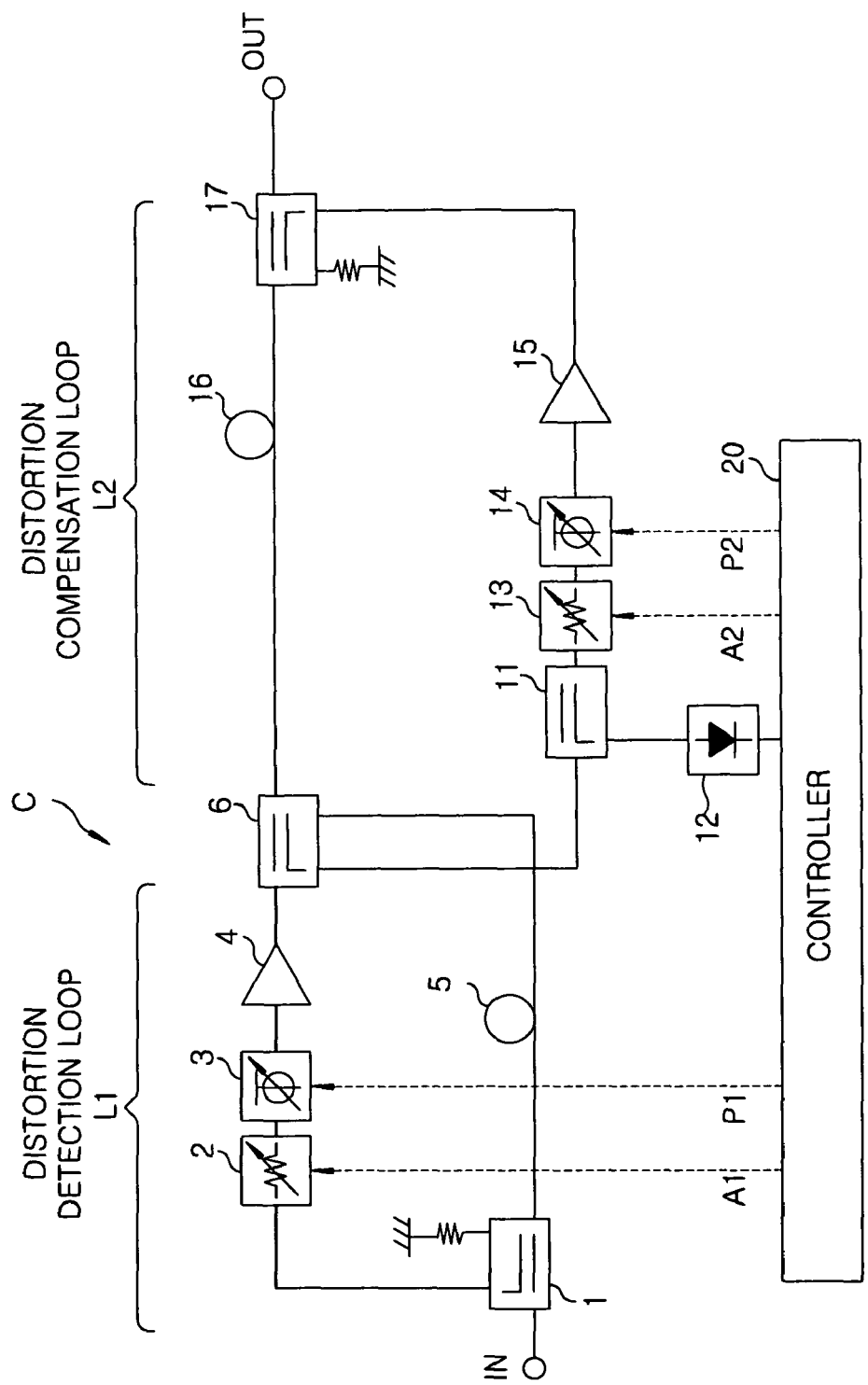
FIG. 1 illustrates a configuration example of a conventional feedforward distortion compensation amplifier.

First, a configuration example of a conventional feedforward distortion compensation amplifier will be described. FIG. 1 illustrates the configuration example of the conventional feedforward distortion compensation amplifier.

(Feedforward Distortion Compensation Amplifier)

A base station and a relay station for mobile communication RF-amplify a multi-carrier signal including a plurality of carrier waves appropriately modulated at a predetermined frequency interval and, then, wirelessly transmit the RF-amplified multi-carrier signal. When the linearity of an amplifier used for RF amplification is not sufficiently high, various distortions such as intermodulation distortion are generated. These distortions prevent the realization of normal or high quality communications. Therefore, high linearity is required for the amplifier used to amplify the multi-carrier signal over the entire frequency band, to which the multi-carrier signal belongs. A feedforward distortion compensation method is used to realize an ultra-low distortion amplifier appropriate to amplify the multi-carrier signal.

As illustrated in FIG. 1, a feedforward distortion compensation amplifier C includes a directional coupler 1, to which an input signal of a multi-carrier signal is applied through an input terminal, a variable attenuator 2 connected to the directional coupler 1 to variably attenuate the input signal, and a variable phase shifter 3 connected to the variable attenuator 2 to shift the phase of the input signal. The feedforward distortion compensation amplifier C further includes a main amplifier 4 connected to the variable phase shifter 3 to amplify the input signal, a delay unit 5 connected to the directional coupler 1 to delay the input signal, and a directional coupler 6 for receiving signals outputted from the main amplifier 4 and the delay unit 5 to branch the coupled signal into multiple signals.

Further, the feedforward distortion compensation amplifier C includes a delay unit 16 for delaying the signal from the directional coupler 6, directional coupler 17 for receiving the delayed signal, a directional coupler 11 for receiving the signal from the directional coupler 6, and a detection circuit 12 for detecting a signal from the directional coupler 11. The feedforward distortion compensation amplifier C further includes a variable attenuator 13 for variably attenuating the signal from the directional coupler 11, a variable phase shifter 14 for shifting the phase of the signal from the variable attenuator 13, an auxiliary amplifier 15 connected to the variable phase shifter 14 to amplify an input signal, and the directional coupler 17 for receiving the signal from the delay unit 16 and the signal from the auxiliary amplifier 15.

The feedforward distortion compensation amplifier C having such a configuration operates as follows. That is, when a signal is applied to an input terminal IN, the signal is inputted to the variable attenuator 2 and the variable phase shifter 3 through the directional coupler 1 so that the amplitude and phase of the signal are adjusted in accordance with control signals A1 and P1 from a controller 20 and the signal is amplified by the main amplifier 4. The signal amplified by the main amplifier 4 is then inputted to the directional coupler 17 through the directional coupler 6 and the delay unit 16.

Further, the signal inputted through the input terminal IN is branched into two signals by the directional coupler 1. The two branched signals are the same signals in terms of frequency components. However, the branched signal supplied to a main line is amplified by the main amplifier 4, whereas the branched signal supplied to a distortion detection loop L1 is supplied from the directional coupler 1 to the directional coupler 6 through the delay unit 5 with its amplitude maintained. The signal supplied to the directional coupler 6 through the delay unit 5 is coupled to a signal including a distortion component by the directional coupler 6.

The directional coupler 6 branches the signal, which is outputted from the main amplifier 4 and contains a distortion component, into two signals. The two branched signals are the same signals in terms of frequency components. One branched signal is supplied to the main line and the other branched signal is supplied to a distortion compensation loop L2. When the latter branched signal is supplied to the distortion compensation loop L2, the directional coupler 6 couples this signal to the signal passed through the delay unit 5 to cancel carrier components of these signals and to extract distortion components from these signals.

The signal obtained as a result of this coupling is supplied from the directional coupler 6 to the variable attenuator 13, the variable phase shifter 14, and the auxiliary amplifier 15 forming the distortion compensation loop L2 through the directional coupler 11. Accordingly, the amplitude and phase of the signal are adjusted by the variable attenuator 13 and the variable phase shifter 14 in accordance with control signals A2 and P2 from the controller 20 and the signal is amplified by the auxiliary amplifier 15 and then inputted to the directional coupler 17. The signal inputted to the directional coupler 17 is coupled to the signal passed through the delay unit 16 by the directional coupler 17.

The branched signal outputted from the main amplifier 4 is coupled to the signal passed through the delay unit 5 to thereby cancel the carrier component and to extract the distortion generated by the main amplifier 4 and the like. For this, the carrier component contained in the branched signal outputted from the main amplifier 4 and the carrier component contained in the signal passed through the delay unit 5 must have the same delays, the same amplitudes, and inverse phases at a coupling point of time in the directional coupler 6. The delay unit 5 is required for making the carrier components have the same delays. Further, the variable attenuator 2, the variable phase shifter 3, and a controller 20 for adjusting and controlling the control signals A1 and P1 used therein to have optimal values are required for making the carrier components have the same amplitudes and inverse phases.

The delay unit 5, the variable attenuator 2, the variable phase shifter 3 and the controller 20 serve to adjust the signal outputted from the directional coupler 6 so that the signal that contains only the distortion component but does not contain the carrier component is supplied to the auxiliary amplifier 15. In a detailed control method, the signal to be inputted to the variable attenuator 13 is branched by the directional coupler 11 and is detected by the detection circuit 12. The controller 20 appropriately controls the variable attenuator 2 and the variable phase shifter 3 in accordance with the control signals A1 and P1 to minimize the detected signal, thereby extracting the signal that contains only the distortion component but does not contain the carrier component.

Further, in order to compensate for the distortion by coupling the signal passed through the delay unit 16 to the signal passed through the auxiliary amplifier 15, the distortion component of the signal passed through the delay unit 16 and the distortion component of the signal passed through the auxiliary amplifier 15 must have the same delays, the same amplitudes, and inverse phases at a coupling point of time in the directional coupler 17. The delay unit 16 is required for making the distortion components have the same delays. The controller 20 appropriately controls the variable attenuator 13 and the variable phase shifter 14 in accordance with the control signals A2 and P2 to make the distortion components have the same amplitudes and inverse phases, thereby extracting the signal that contains only the distortion component but does not contain the carrier component.

This feedforward distortion compensation amplifier is designed to secure an output back-off of the main amplifier so as to sufficiently compensate for the distortion at specified maximum output power. Therefore, at output power lower than the maximum output power, the back-off of the main amplifier is sufficient so that a small amount of distortion is generated. Further, since the power inputted to the auxiliary amplifier is low, the output power of the auxiliary amplifier is also low. Therefore, at the low output power, the saturation power required by the auxiliary amplifier may be lower than the maximum output power. At the low output power, the main amplifier and the auxiliary amplifier have more back-offs than required, which is not proper in terms of power consumption of a device.

(Feedforward Distortion Compensation Amplifier Whose Amplification Rate is Optimized depending on a Power Value)

Figure 2:
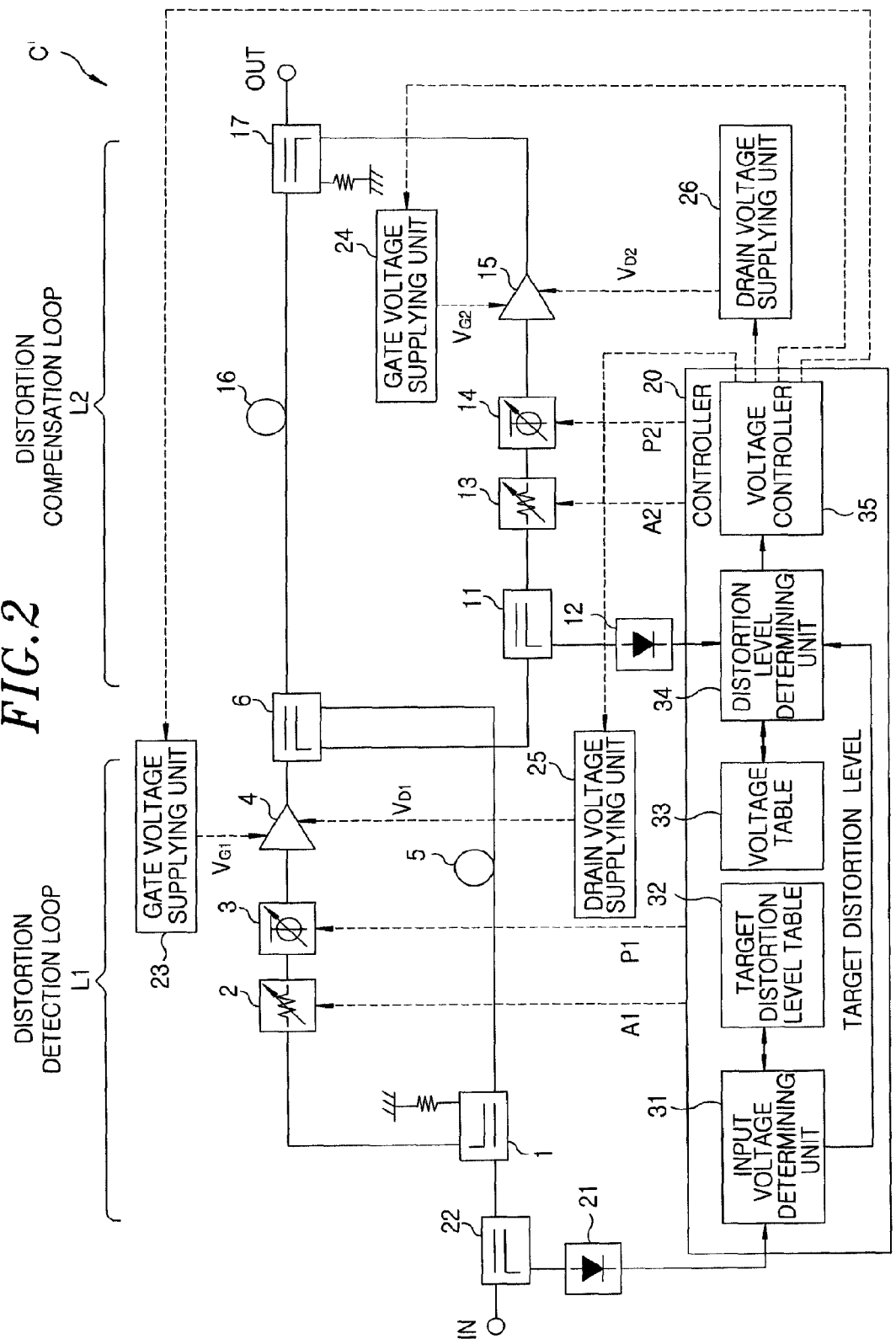
FIG. 2 illustrates a configuration example of a feedforward distortion compensation amplifier in accordance with an embodiment of the present invention.
Figure 5:
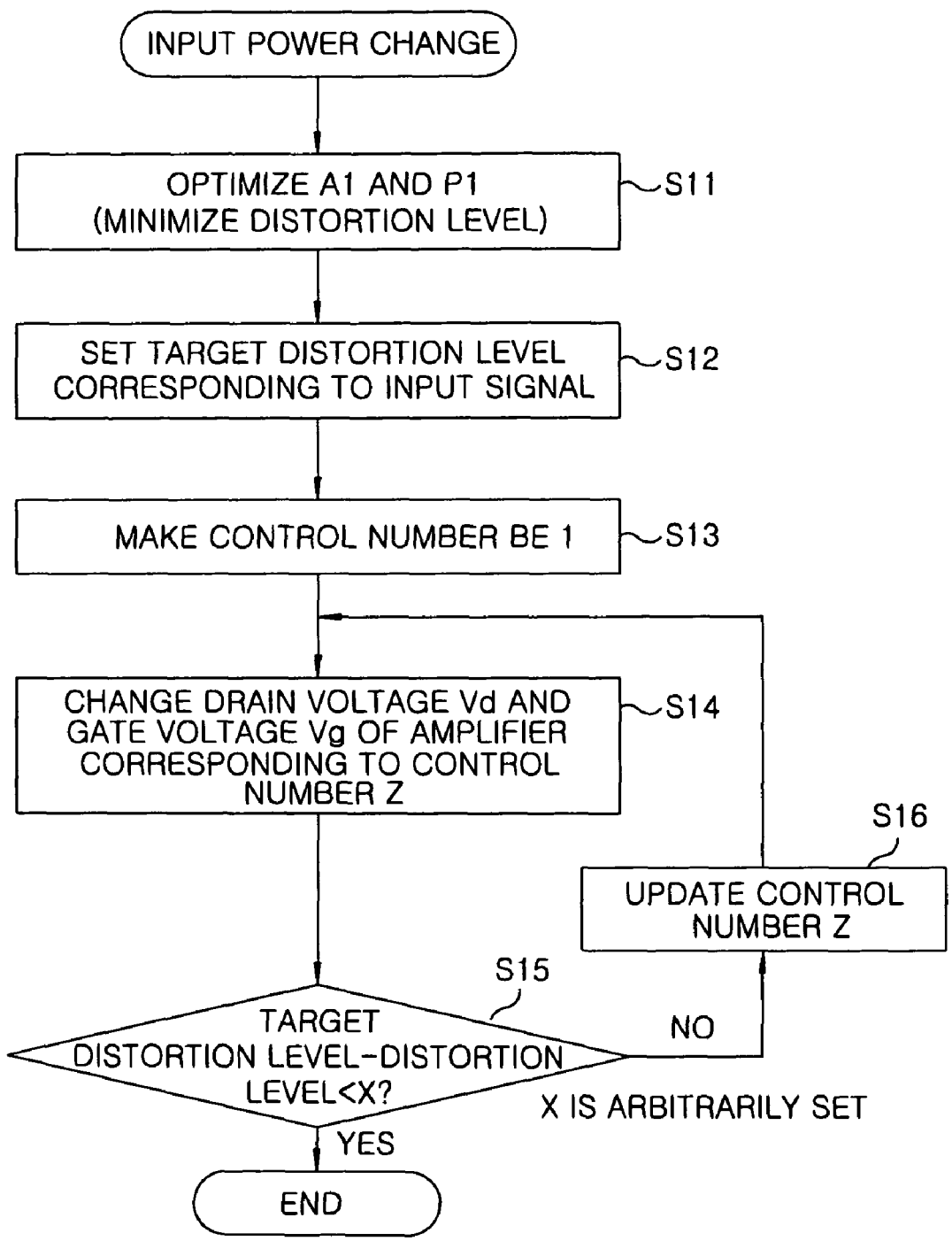
FIG. 5 is a flowchart illustrating an example of a method of controlling an amplifier step by step.

Next, a feedforward distortion compensation amplifier for uniformly performing an efficient amplification process whether the power level of an input signal is low or high by optimizing an amplification rate based on an output power value will be described in detail with reference to the drawings. FIG. 2 illustrates a configuration example of a feedforward distortion compensation amplifier in accordance with an embodiment of the present invention. FIG. 3 is a table illustrating an example of target distortion levels corresponding to input powers. FIG. 4 is a voltage table showing an example of gradual control voltages. FIG. 5 is a flowchart illustrating an example of a method of controlling an amplifier step by step. FIG. 6 is a voltage table illustrating an example of gradual control voltages according to control numbers.

That is, a feedforward distortion compensation amplifier C' whose amplification rate is optimized depending on a power value basically has the same configuration as the feedforward distortion compensation amplifier illustrated in FIG. 1 as illustrated in FIG. 2. Here, only the components that are not provided in the feedforward distortion compensation amplifier C will be described.

The feedforward distortion compensation amplifier C' further includes a directional coupler 22, to which an input signal serving as a multi-carrier signal is applied through an input terminal, and a detection circuit 21 for detecting a signal from the directional coupler 22 to supply the detected signal to the controller 20. Further, the directional coupler 22 supplies a branched signal to the directional coupler 1.

Further, the feedforward distortion compensation amplifier C' includes a gate voltage supplying unit 23 for supplying a gate voltage $V_{G1}$ to the main amplifier 4 under the control of the controller 20, a drain voltage supplying unit 25 for supplying a drain voltage $V_{D1}$ to the main amplifier 4 under the control of the controller 20, a gate voltage supplying unit 24 for supplying a gate voltage $V_{G2}$ to the auxiliary amplifier 15 under the control of the controller 20, and a drain voltage supplying unit 26 for supplying a drain voltage $V_{D2}$ to the auxiliary amplifier 15 under the control of the controller 20.

The controller 20 of the feedforward distortion compensation amplifier C' includes an input voltage determining unit 31 for receiving the detected signal from the detection circuit 21 to determine a voltage, a target distortion level table 32 showing target distortion levels corresponding to power values, a voltage table 33 showing drain voltage values and gate voltage values according to control numbers, a distortion level determining unit 34 for determining distortion levels, and a voltage controller 35 for controlling the gate voltage supplying unit 23, the drain voltage supplying unit 25, the gate voltage supplying unit 24 and the drain voltage supplying unit 26.

In the feedforward distortion compensation amplifier C' having the above configuration, the signal detected by the detection circuit 21 for detecting input power and the signal (distortion level) detected by the detection circuit which is used for extracting distortion at the input terminal of the auxiliary amplifier are used, and the operation conditions of the main amplifier and the auxiliary amplifier appropriate for the magnitude of the input power are set, thereby realizing high efficiency. Hereinafter, the operation of the feedforward distortion compensation amplifier C' will be described with reference to the flowchart of FIG. 5.

An RF signal is inputted to the input terminal IN and the branched signal outputted from the main amplifier 4 is coupled to the signal passed through the delay unit 5 to thereby cancel carrier components and extract the distortion generated by the main amplifier 4. For this, the carrier component contained in the branched signal outputted from the main amplifier 4 and the carrier component contained in the signal passed through the delay unit 5 should be adjusted and controlled to have the same delays, the same amplitudes, and inverse phases at a coupling point of time in the directional coupler 6. Accordingly, the control signals A1 and P1 are supplied as optimal values from the controller 20 to the variable attenuator 2 and the variable phase shifter 3 to realize the above purposes (step S11). That is, the controller 20 sets the control signals A1 and P1 as proper values in order to minimize the power detected by the detection circuit 12 provided at an input part of the auxiliary amplifier. The above operation is the same as the operation of the feedforward distortion compensation amplifier C of FIG. 1.

Further, the signal inputted to the input terminal IN is branched off by the directional coupler 22 and the input power is detected by the detection circuit 21. The controller 20 determines a target distortion level, representing a distortion level that is intended to be controlled and corresponding to the value of the input power, from an example of the target distortion levels of the distortion level table illustrated in FIG. 3 (step S12). The target distortion level is the level of the signal that contains only the distortion component of the main amplifier but does not contain the carrier component when the control values A1 and P1 are optimally controlled, that is, represents the magnitude of the distortion component.

As one example, in FIG. 3, when the input power is 100 mW, the target distortion level is set as 5 mW, which is about 5% of the input power. That is, the target distortion level represents an absolute value of distortion power at which a ratio IM of the carrier component to the distortion component of the main amplifier at a maximum output level is almost equal to that at a low output level in consideration of the characteristics of the amplification element of the main amplifier.

The controller 20 makes a control number Z be 1 as predetermined by the voltage table of FIG. 4 (step S13). Then, the controller 20 sets or changes the drain voltage and the gate voltage supplied to the amplification element of the main amplifier (step S14). For example, when the control number Z is 1, the drain voltage and the gate voltage are set to be 0.1 V and 0.2 V, respectively. The relationship among the target distortion level, the drain voltage, and the gate voltage is represented in the table of FIG. 6.

Then, the controller 20 compares the determined target distortion level with a current distortion level detected by the detection circuit 21 to determine the following:

Target distortion level−Distortion level<X, that is, whether a difference between the target distortion level and the distortion level is smaller than X, where X is an arbitrary integer (step S15).

When it is determined by the controller 20 that the difference between the target distortion level and the distortion level is smaller than X, that is, that the difference is zero or in the range of the value of X, it is determined that control is sufficiently performed and thus the process is completed. When it is determined that the difference between the target distortion level and the distortion level is not in the range of the value of X, the process goes to step S16 under control of the controller 20 to increase the value of the control number Z by one. For example, Z is increased from 1 to 2, and the drain voltage and the gate voltage are changed to 0.2 V and 0.4 V, respectively, when the control number is 2 as illustrated in FIG. 4 (step S14). Then, it is determined again whether the difference between the target distortion level and the distortion level is smaller than X.

The controller 20 continues the above process step by step until the difference between the target distortion level and the distortion level is smaller than X, thereby supplying the drain voltage and the gate voltage that are optimal to the value of the input power to the main amplifier 4 and the auxiliary amplifier 15.

In general, when the drain voltage supplied to the amplification element is reduced, the output back-off and the outputtable maximum power (saturation power) of the amplification element are also reduced. Therefore, when it is assumed that output powers are equal, distortion increases. Further, the gate voltage is set such that idling current is uniform at the respective drain voltages. In this way, the drain voltage and the gate voltage are gradually changed to change the distortion power of the main amplifier and to perform control such that the distortion level approaches the target distortion level. Therefore, in particular, even when the input power is low, that is, even when the output power of the main amplifier is low, the ratio IM can be made almost equal to that at high output power.

Also, as for the auxiliary amplifier, the drain voltage Vd and the gate voltage Vg to be supplied to amplification element, which are preset and optimal as illustrated in FIG. 6, are set based on the determined distortion level. The drain voltage Vd and the gate voltage Vg are determined by considering the characteristics of the amplification element of the auxiliary amplifier and the back-off as much as required for the input distortion level, that is, the input power to the auxiliary amplifier.

As described above, in the feedforward distortion compensation amplifier C' in accordance with the embodiment of the present invention, it is possible to perform a highly efficient amplification process while satisfying the required distortion standard even at a low power level.

While the invention has been shown and described with respect to the embodiments, it will be understood by those skilled in the art that various changes and modification may be made without departing from the scope of the invention as defined in the following claims.

What is claimed is:

1. A feedforward distortion compensation amplifier, comprising:
    an adjusting unit for adjusting a gain and a phase of an input signal;
    a first amplifier for amplifying a signal outputted from the adjusting unit;
    a delay unit for delaying the input signal;
    a coupler for coupling a signal outputted from the delay unit to a signal outputted from the first amplifier;
    a first controller which detects a distortion component of the first amplifier to control an operation of the adjusting unit based on the distortion component; and
    a second controller which determines one distortion level from distortion levels based on a magnitude of the input signal, and compares the determined distortion level with the detected distortion component of the first amplifier to control a ratio of a carrier component to the distortion component of the first amplifier based on comparison results.

2. The feedforward distortion compensation amplifier of claim 1, further comprising a second amplifier for amplifying the signal outputted from the first amplifier,
    wherein the second controller controls the first amplifier and the second amplifier based on the comparison results.

3. The feedforward distortion compensation amplifier of claim 2, wherein the second controller optimizes a gate voltage and a drain voltage of the first amplifier and a gate voltage and a drain voltage of the second amplifier based on the comparison results to thereby control the first amplifier and the second amplifier.

4. The feedforward distortion compensation amplifier of claim 1, wherein the second controller gradually changes a drain voltage and a gate voltage of the first amplifier to change a distortion power of the first amplifier and to perform control such that a distortion level of the first amplifier approaches the determined distortion level.

5. The feedforward distortion compensation amplifier of claim 2, wherein the second controller gradually changes a drain voltage and a gate voltage of the first amplifier to change a distortion power of the first amplifier and to perform control such that a distortion level of the first amplifier approaches the determined distortion level.

6. The feedforward distortion compensation amplifier of claim 3, wherein the second controller gradually changes the drain voltage and the gate voltage of the first amplifier to change a distortion power of the first amplifier and to perform control such that a distortion level of the first amplifier approaches the determined distortion level.

* * * * *